United States Patent

Pfaff et al.

[11] Patent Number: 6,040,779
[45] Date of Patent: Mar. 21, 2000

[54] METHOD AND CIRCUIT FOR MONITORING THE FUNCTIONING OF A SENSOR BRIDGE

[75] Inventors: Georg Pfaff, Markgroeningen; Herbert Keller, Wiernsheim, both of Germany

[73] Assignee: Robert Bosch GmbH, Stuttgart, Germany

[21] Appl. No.: 09/242,804

[22] PCT Filed: Jun. 19, 1998

[86] PCT No.: PCT/DE98/01698

§ 371 Date: Feb. 24, 1999

§ 102(e) Date: Feb. 24, 1999

[87] PCT Pub. No.: WO99/01777

PCT Pub. Date: Jan. 14, 1999

[30] Foreign Application Priority Data

Jul. 3, 1997 [DE] Germany ............... 197 28 381

[51] Int. Cl.$^7$ ................................. G08B 21/00
[52] U.S. Cl. .............. 340/661; 340/653; 363/17; 361/93; 324/706
[58] Field of Search ............... 340/661, 551, 340/653, 657; 324/706; 363/17; 361/92, 93

[56] References Cited

U.S. PATENT DOCUMENTS

| | | | |
|---|---|---|---|
| 4,845,435 | 7/1989 | Bohan, Jr. | 324/537 |
| 4,947,309 | 8/1990 | Jonsson | 363/17 |
| 5,734,269 | 3/1998 | Sakai et al. | 324/706 |

Primary Examiner—Edward Lefkowitz
Attorney, Agent, or Firm—Michael J. Striker

[57] ABSTRACT

Monitoring of the function of a symmetrical sensor bridge circuit is performed in that the signal from the positive or negative half-bridge is subtracted from half the bridge supply voltage ($V_s/2$) in a summing member (2) and is subsequently amplified by an amplifier (3) in such a way that it corresponds to the full bridge signal ($V_{in}$). The full bridge signal ($V_{in}$) is compared with the amplified difference signal in a comparator (5). If the difference signal deviates in an unacceptable manner from the full bridge signal, the comparator switches an alarm signal on the output signal (6) of the sensor, so that this output signal is placed into a range which lies outside of the normal operational range of the sensor.

12 Claims, 1 Drawing Sheet

METHOD AND CIRCUIT FOR MONITORING THE FUNCTIONING OF A SENSOR BRIDGE

BACKGROUND OF THE INVENTION

This invention relates to a method and a circuit arrangement for monitoring the function of a symmetrical sensor bridge circuit having sensor elements, which are connected in a full bridge circuit. A semiconductor sensor in the form of a symmetrical bridge circuit, known from the prior art, and a differential amplifier circuit, which generates an output signal of the sensor bridge circuit, are often used for detecting a physical quantity, for example pressure, velocity, acceleration or the like. Within a defined measuring voltage range, this output signal from the sensor bridge circuit indicates the physical quantity to be measured, for example the pressure, as a mostly linear function.

When employing such a sensor bridge circuit in a safety-related measuring device, for example in the anti-blocking system of a motor vehicle, it is very important for the safety of the motor vehicle and its occupants that the function of the sensor be continuously monitored during its operation, and that, in case of a malfunction of the sensor, it is possible to immediately generate an alarm signal which indicates this malfunction. In this connection it is important that not only disruptions in the lines leading to and from the sensor bridge circuit, the supply lines and similar can be detected, but also malfunctions which can cause the outage of the pressure sensor, so that slowly occurring changes, for example changes of the characteristic curve of the pressure sensor, the amount of amplification of the integrated amplifiers, etc., which degrade the accuracy of the measurement, can be detected.

A known sensor error detection device for detecting a line break or a short circuit, known from U.S. Pat. No. 4,845,435, has a resistor for generating a sensor compensation output signal between an output connection on the ground side of a sensor and the sensor. A comparison of the sensor output signal generated in this way with a reference voltage makes possible the drawing of a conclusion regarding the status or the functional ability of the sensor by means of the output state of a comparator employed for this. If, for example, a sensor is connected with an A/D-converter, the dependability of the known arrangement for the detection of interruptions of the respective voltage supply connections, the output connections and the ground connections of the sensors is not assured.

SUMMARY OF THE INVENTION

It is the object of the invention to make possible a method and a circuit arrangement for monitoring the function of a symmetrical sensor bridge circuit having sensor elements which are connected in a full bridge circuit, in such a way, that it is automatically possible to monitor the sensor signal in all operational states without disruption of the chain of measured signals and, at low cost expenditure, not only the sensor input lines, the supply voltage lines, the bonded connections, but also the bridge resistors, all of the amplifiers and the adjustment and compensation modules of the chain of measured signals.

A method in accordance with the invention for monitoring the function of a symmetrical sensor bridge circuit, by means of which the above objects are attained, is distinguished by the following steps:

derivation of a full bridge signal from the sensor bridge circuit;

derivation of a half-bridge signal from the positive or the negative half-bridge circuit;

subtraction of the instantaneous level of this half-bridge signal from half the bridge supply voltage while forming a difference signal;

amplification of the difference signal by a defined amplification factor, so that it corresponds to the full bridge signal if the sensor bridge circuit operates correctly;

comparison of the full bridge signal with the amplified difference signal; and generation of an alarm signal if the amplified difference signal deviates from the full bridge signal in an unacceptable manner.

In accordance with the invention this method is advantageously further developed in that the full bridge signal is amplified and the output signal of the sensors is formed from it, and that the alarm signal is generated with a fixed level, a fixed frequency or the like and is superimposed on the output signal of the sensor.

The level of the alarm signal is advantageously selected in such a way that in case of an alarm the output signal of the sensor is placed outside the normal operating range of the sensor.

Furthermore, the amplified difference signal and the full bridge signal are advantageously subjected to processing regarding the offset and the sensitivity to the same extent and simultaneously prior to the comparison step.

The method in accordance with the invention is used for monitoring the function of a pressure sensor, which is used in connection with pressure measurements in an anti-blocking system of a motor vehicle.

The method in accordance with the invention can furthermore be employed for monitoring a function of a pressure sensor which is used in Diesel or gasoline injection systems, or for the pressure measurement in a steering gear or transmission, or in an air conditioning system of a motor vehicle.

In accordance with a further aspect of the invention, the above mentioned object is attained by a circuit arrangement for monitoring the function of a symmetrical sensor bridge circuit, wherein the circuit arrangement is distinguished in accordance with the invention by a differential amplifier connected with the measuring connectors of the sensor bridge circuit for forming a full bridge signal, which constitutes the measured signal, from the difference between the positive and negative half-bridge signals;

a summing member connected with the positive or negative measuring connector of the sensor bridge circuit for subtracting the instantaneous level of the positive or negative half-bridge signal from half the bridge supply voltage, and generation of a corresponding difference signal;

an amplifying member connected with the summing member for the amplification of the difference signal by a defined amplification factor, so that the difference signal corresponds to the full bridge signal when the sensor bridge circuit operates correctly;

a comparator, which is connected with the amplification member for comparing the full bridge signal with the amplified difference signal, and an alarm signal generator, which is activated by the output signal of the comparator for generating an alarm signal if the difference signal amplified by the amplifying member deviates from the full bridge signal in an unacceptable manner.

The comparator preferably has a window comparator, whose output signal is the alarm signal and on which an output signal of the sensor, amplified by a second amplifying member, is superimposed as the additional voltage, so that in case of a fault of the sensor, the output signal is in a signal range outside of the normal operating range of the sensor.

An offset and sensitivity correction device is optionally and preferably provided, which subjects the difference signal amplified by the amplifying member and the full bridge signal to processing in respect to the offset and the sensitivity to the same extent and simultaneously prior to them being compared in the comparator.

In accordance with the invention it is furthermore possible by means of a base voltage generator to superimpose a base voltage on the output signal of the sensor, which brings the output signal of the sensor into the operating range of the latter.

It is furthermore possible to provide means with which it is initially possible to set the amounts of amplification of the amplification members, the reference voltages of the comparator and of the base voltage generator, which define the normal operating range and the alarm signal range, in accordance with the supply voltage and the characteristic values of the sensor full bridge circuit used.

Through the above recited characteristics of the attainment of the object, a second signal measuring path is built by means of the comparison of the half-bridge signals with the full bridge signal. This second path is compared in the sensor with the main measuring channel. By means of this a sensor is created in the sensor, wherein the test or monitoring channel is exclusively used for checking the main measuring channel.

The method in accordance with the invention and the circuit arrangement therefore make possible an automatic monitoring of the function of the sensor bridge circuit during operation, both in the state where the sensor is charged with pressure and where it is not under pressure.

BRIEF DESCRIPTION OF THE DRAWINGS

Further advantageous characteristics and objects of the invention will become clear by means of the following description of an exemplary embodiment, when it is read making reference to the single drawing figure.

The drawing figure represents a preferred exemplary embodiment in the form of a functional block diagram of a circuit arrangement for monitoring the function of a symmetrical sensor bridge circuit, in particular for measuring pressure in a brake arrangement with an anti-blocking system.

DETAILED DESCRIPTION OF THE PREFERRED EMBODIMENT

Figure 1:
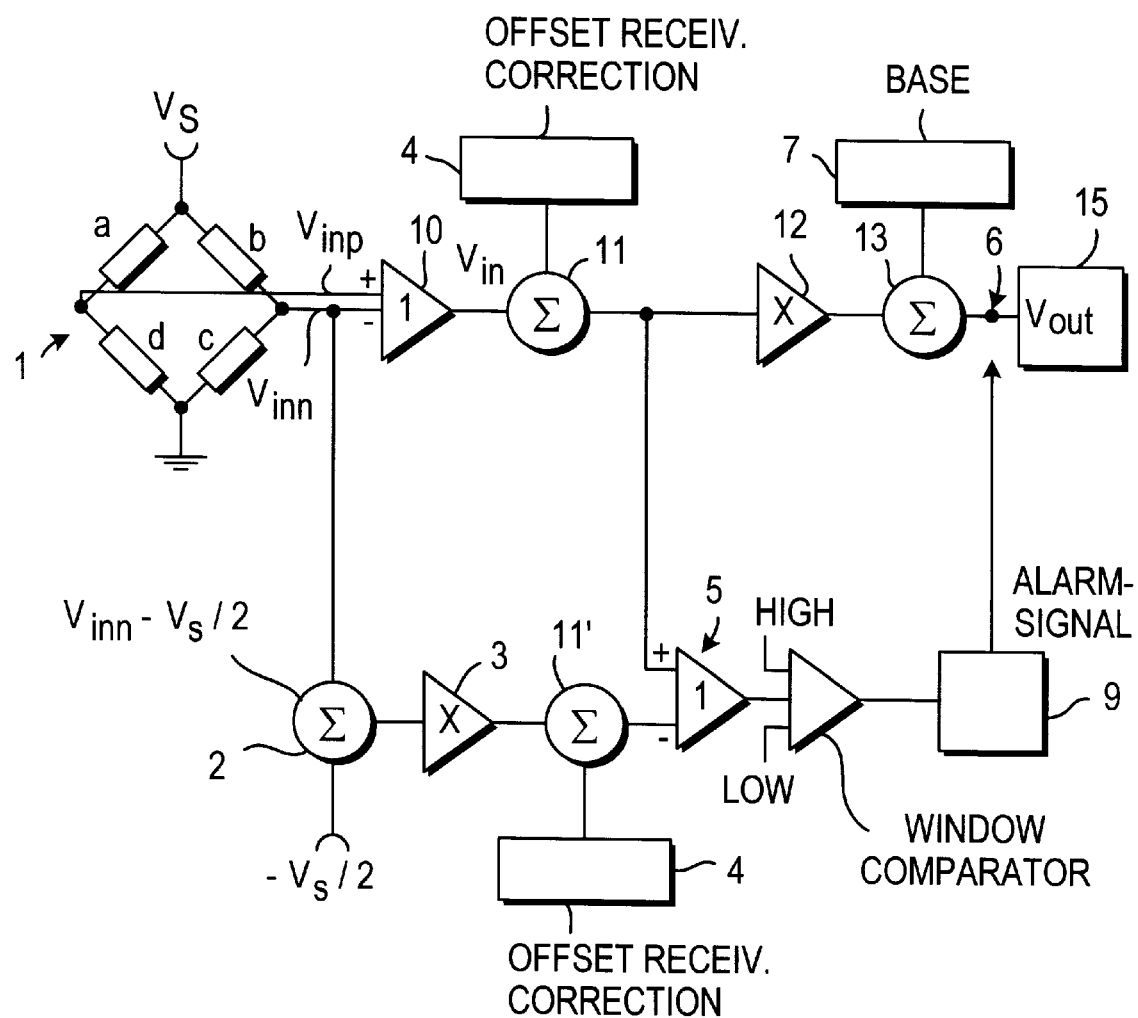

The block diagram of the exemplary embodiment of the monitoring circuit in accordance with the invention represented in the drawing figure shows a measuring sensor, for example a pressure sensor 1, wherein four identical sensor elements a, b, c, d are connected in the form of a symmetrical full bridge circuit. The supply voltage connector of this full bridge circuit is connected to a supply voltage $V_s$ and on the other side to ground. A positive output signal $V_{inp}$ and a negative output signal $V_{inn}$ of the symmetrical full bridge circuit are respectively connected to a positive and a negative input connector of a differential amplifier, from whose output a full bridge signal $V_{in}$ is issued. This full bridge signal $V_{in}$ is conducted in a main measuring channel I via a summing node 11, whose function will be explained further down below, to an amplifier (second amplifying member) 12 with a fixed amount of amplification. The main measuring channel I furthermore leads via a further summing node 13 to an output connector 15, to which a sensor output voltage 6 ($V_{out}$) is applied.

Furthermore, a test or monitoring signal channel II is formed in that half the bridge supply voltage $V_2/2$ is subtracted from the negative half-bridge signal $V_{inn}$ by a further summing node 2 and is subsequently amplified in an amplifier 3, whose amount of amplification has been set such that the amplified difference signal $V_{inn}/2$ corresponds to the full bridge signal $V_{in}$. This amplified difference signal is supplied via a further summing node 11' to a comparator 5 having a differential amplifier in connection with a window comparator. The amplified difference signal is compared in the comparator 5 with the non-amplified full bridge signal $V_{in}$. If now the amplified difference signal deviates in an unacceptable manner from the full bridge signal, the output signal from the window comparator activates an alarm signal generator 9, which puts an additional voltage on the output signal $V_{out}$ at the output connector 15 of the sensor, which moves the output signal of the sensor into a signal range which lies outside of the normal operating range of the sensor.

By means of the previously mentioned steps a sensor in the sensor is made possible, wherein the test and monitoring channel II is exclusively used for checking the function of the main measuring channel I. The sensor monitors its own function automatically during operation in the pressure-charged or pressure-free of the pressure sensor 1.

An offset and sensitivity correction device 4 is used to subject the full bridge signal $V_{in}$ and the amplified difference signal $V_{inn}-V_s/2$ to an offset and sensitivity correction (for example a temperature error compensation), when required, so that these two signals have the same signal in regard to offset and sensitivity. To this end the two signals $V_{in}$ and $V_{inn}-V_s/2$ are charged with a correcting voltage in the two summing nodes 11, 11' located in the main measuring channel I and in the test and monitoring channel II.

A constant voltage, for example 0.5 V, is applied to the measured signal by a base voltage generator 7 via a further summing node 13 contained in the main measuring channel I, so that the output signal $V_{out}$ is brought within the operating range of the sensor.

The components and switching elements represented in the drawing figure are preferably integrated in the form of an integrated circuit on a common substrate. The components required for monitoring the function of the sensor bridge circuit only slightly increase the chip surface of the integrated circuit, so that the increase in cost created by this is negligible.

It is of course also possible to pick up the positive half-bridge signal $V_{inp}$ from the sensor half bridge, instead of the negative half-bridge signal $V_{inn}$, and the difference with the half of the supply voltage can be formed.

As a whole, the measurement principle in accordance with the invention allows the monitoring of the measured signal provided by a symmetrical full bridge circuit during all operational states, in that a monitoring signal is taken from the bridge signal without interruption of the measuring signal chain and compared with the full bridge signal, so that the measured signal is continuously available. Not only are the input and output lines from the measuring bridge as well as the voltage supply lines automatically monitored for breaks and short circuits by means of this, but also the bridge resistors and all of the amplifiers as well as the adjustment and compensation modules.

We claim:

1. A method for monitoring the function of a symmetrical sensor bridge circuit (1) having sensor elements (a, b, c, d), which are connected in a full bridge circuit and are supplied by a bridge supply voltage characterized by the following steps:

derivation of a full bridge signal ($V_{in}$) from the sensor bridge circuit;

derivation of a half-bridge signal ($V_{inp}$, $V_{inn}$) from the positive or the negative half-bridge circuit;

subtraction of the instantaneous level of the half-bridge signal ($V_{inp}$, $V_{inn}$) from half the bridge supply voltage ($V_s/2$) while forming a difference signal ($V_{inn}-V_s/2$);

amplification of the difference signal by a defined amplification factor (x), so that it corresponds to the full bridge signal ($V_{in}$) if the sensor bridge circuit (1) operates correctly;

comparison of the full bridge signal ($V_{in}$) with the amplified difference signal; and generation of an alarm signal if the amplified difference signal deviates from the full bridge signal ($V_{in}$) in an unacceptable manner.

2. The method in accordance with claim 1, characterized in that the full bridge signal ($V_{in}$) is amplified and the output signal ($V_{out}$) of the sensor is formed from it, and the alarm signal is generated at a fixed level, fixed frequency and superimposed on the output signal ($V_{out}$) of the sensor.

3. The method in accordance with claim 2, characterized in that the level of the alarm signal is selected so that in case of an alarm the output signal of the sensor is placed outside of the normal operating range of the sensor.

4. The method in accordance claim 1, characterized in that the amplified difference signal and the full bridge signal ($V_{in}$) are processed in respect to offset and sensitivity in the same way and simultaneously prior to the comparison step.

5. Use of the method in accordance with claim 1 for monitoring the function of a pressure sensor, which is employed in measuring the pressure in an anti-blocking system or with Diesel or gasoline injection methods, or for measuring the pressure in steering gears, air conditioning systems or transmissions of a motor vehicle.

6. A circuit arrangement for monitoring the function of a symmetrical sensor bridge circuit (1) having sensor elements (a, b, c, d), which are connected in a full bridge circuit and are supplied by a bridge supply voltage ($V_s$), characterized by a differential amplifier (10) connected with the measuring connectors of the sensor bridge circuit for forming a full bridge signal ($V_{in}$), which constitutes the measured signal, from the difference between the positive and negative half-bridge signals ($V_{inp}-V_{inn}$);

a summing member (2) connected with the positive or negative measuring connector of the sensor bridge circuit (1) for subtracting the instantaneous level of the positive or negative half-bridge signal ($V_{inp}$ or $V_{inn}$) from half the bridge supply voltage ($V_s/2$), and generation of a corresponding difference signal ($V_{inn}-V_s/2$);

an amplifying member (3) connected with the summing member (2) for the amplification of the difference signal by a defined amplification factor (x), so that the difference signal corresponds to the full bridge signal ($V_{in}$) when the sensor bridge circuit operates correctly;

a comparator (5), which is connected with the amplification member (3) for comparing the full bridge signal ($V_{in}$) with the amplified difference signal, and an alarm signal generator (9), which is activated by the output signal of the comparator (5) for generating an alarm signal if the difference signal amplified by the amplifying member (3) deviates from the full bridge signal ($V_{in}$) in an unacceptable manner.

7. The circuit arrangement in accordance with claim 6, characterized in that the comparator (5) has a window comparator, whose output signal is the alarm signal and on which an output signal (6) of the sensor, amplified by a second amplifying member (12), is superimposed as the additional voltage, so that in case of a fault of the sensor the output signal is placed into a signal range outside of the normal operating range of the sensor.

8. The circuit arrangement in accordance with claim 6, characterized in that an offset and sensitivity correction device (4) is provided, which subjects the difference signal amplified by the first amplifying member (3) and the full bridge signal ($V_{in}$) to processing in respect to the offset and the sensitivity to the same extent and simultaneously prior to them being compared in the comparator (5).

9. The circuit arrangement in accordance with claim 6, characterized in that a base voltage (+Sockel) is superimposed on the output signal of the sensor by means of a base voltage generator (7), which brings the output signal into the operating range of the sensor.

10. The circuit arrangement in accordance with claim 6, characterized in that means are provided, with which the amounts of amplification of respectively the first and second amplification members (3, 12), the reference voltages of the comparator and of the base voltage generator (7) defining the normal operating range and the alarm signal range in accordance with the supply voltage and the characteristic values of the sensor full bridge circuit (1) used are initially set.

11. A method of using the circuit arrangement in accordance with claim 6 for monitoring the function of a pressure sensor employed for measuring the pressure in an anti-blocking system of a motor vehicle.

12. A method of using the circuit arrangement in accordance with claim 6 for monitoring the function of a pressure sensor employed for Diesel injection or gasoline injection, in a steering gear, an air conditioning system or an automatic transmission.

* * * * *